United States Patent [19]
Lesko

[11] Patent Number: 4,876,702
[45] Date of Patent: Oct. 24, 1989

[54] PROGRAMMABLE TIME ADVANCE
[75] Inventor: Alan J. Lesko, Fort Collins, Colo.
[73] Assignee: Hewlett-Packard Company, Palo Alto, Calif.
[21] Appl. No.: 225,123
[22] Filed: Jul. 28, 1988
[51] Int. Cl.[4] .............................................. H03L 7/10
[52] U.S. Cl. .................................... 375/120; 331/1 A; 331/179
[58] Field of Search ................................ 375/111–113, 375/120; 364/571–578, 580; 324/520–527; 331/1 A, 4, 14, 17, 18, 179; 455/259–260, 165

[56] References Cited
U.S. PATENT DOCUMENTS 4,105,948  8/1978  Wolkstein ............................ 331/179
4,387,351  6/1983  Furiga et al. ........................ 331/18
4,419,633  12/1983 Phillips ................................. 331/18
4,724,401  2/1988  Hogge Jr. et al. ................... 331/179

Primary Examiner—Benedict V. Safourek
Attorney, Agent, or Firm—Jeffery B. Fromm

[57] ABSTRACT

The programmable time advance circuit functions to offset the inherent delay occasioned by the phase lock loop and the drive circuits of a printed circuit board test system to provide a clock signal at the output of the printed circuit board test system that exactly matches the clock signal of the printed circuit board under test at the printed circuit board under test. This is accomplished by inserting a clock advance signal into the phase locked loop to advance the timing of the clock signal generator circuit in the printed circuit board test system to compensate for the delay occasioned by the conductors and driver circuits in the printed circuit board test system.

16 Claims, 3 Drawing Sheets

PROGRAMMABLE TIME ADVANCE

CROSS-REFERENCE TO RELATED APPLICATION

This application is related to following filed application:

Device For Synchronizing The Output Pulses Of A Circuit With An Input Clock, Inventors: Michael J. Redig and David M. Prater; Ser. No. 065,971, filed June 23, 1987.

FIELD OF THE INVENTION

This invention relates to printed circuit board test systems and, in particular, to apparatus for synchronizing the clock pulses of the printed circuit board test system with the clock pulses of the printed circuit board under test.

PROBLEM

It is a problem in the field of printed circuit board test systems to synchronize the clock pulses of the printed circuit board test system with the clock pulses that are generated on the printed circuit board under test. A printed circuit board test system is a completely integrated set of resources that is used for testing analog, hybrid and digital circuits. The printed circuit board test system typically performs shorts and opens tests; analog, hybrid and digital cluster and functional tests on the devices that are mounted on the printed circuit board.

The test sequences executed by the printed circuit board test system are programmed into the printed circuit board test system by a test engineer to match the operational requirements of the printed circuit board under test. The printed circuit board test system includes a plurality of signal generation circuits and signal detector circuits. The test engineer programs the printed circuit board test system to generate a timed sequence of signals of known magnitude, shape and duration. Electrical interconnection to the printed circuit board under test is accomplished through a "bed of nails" interface that consists of a plurality of electrically conductive pins in a prearranged pattern on the printed circuit board test system. The bed of nails is connected to the signal generation and signal detector circuits. The printed circuit board under test is placed on the bed of nails to electrically interconnect various test points on the printed circuit board under test with the printed circuit board test system. The programmable signal generation circuits are used to apply a timed sequence of signals to various ones of the pins in the bed of nails to drive the printed circuit board under test. The signal detector circuits are connected to other pins on the bed of nails to monitor the response of the printed circuit board under test to these applied test signals.

A problem with this arrangement is that it is difficult to synchronize the clock signals on both the printed circuit board under test and the printed circuit board test system. In particular, in many cases the printed circuit board under test has a clock signal generator circuit which operates independently of the clock signal generator circuit on the printed circuit board test system. In existing printed circuit board test systems, the two clocks are synchronized by the printed circuit board test system monitoring the clock signal generated by the printed circuit board under test and using a phase locked loop to adjust the clock frequency and phase of the clock signal generation circuit on the printed circuit board test system to match the clock signal generated by the printed circuit board under test. The problem with this arrangement is that there exists a finite timing difference between the clock signal generated by the printed circuit board test system and the clock signal generated by the printed circuit board under test, due to the fact that the printed circuit board test system driver circuits have a certain delay time. Thus, while the two clock signals are synchronized at the input of the phase locked loop of the printed circuit board test system, when the clock signal generated by the printed circuit board test system is applied to the printed circuit board under test, there is a certain delay in the signal occasioned by the response time of the driver circuits and associated conductors.

SOLUTION

The above described problems are solved and a technical advance achieved in the field by the programmable time advance circuit of the present invention. This apparatus functions to offset the inherent delay occasioned by the conductors and the driver circuits of the printed circuit board test system to provide a clock signal at the output of the printed circuit board test system that exactly matches the clock signal of the printed circuit board under test at the printed circuit board under test. This is accomplished by inserting a clock advance signal into the phase locked loop to advance the timing of the clock signal generator circuit in the printed circuit board test system to compensate for the delay occasioned by the phase locked loop and driver circuits in the printed circuit board test system.

The clock signal generation circuit in the printed circuit board test system consists of a voltage controlled oscillator which generates a clock signal at a predetermined center frequency, which clock signal is adjustable by a control signal applied to the voltage controlled oscillator. The clock signal generated by the voltage controlled oscillator is applied along with the clock signal from the printed circuit board under test to the input of a phase detector. The phase detector compares the two clock signals and generates a clock adjust signal that is indicative of both the direction and the magnitude of the difference between these two clock signals. This clock adjust signal is applied to the voltage controlled oscillator to adjust the center frequency of the clock signal generated therein to synchronize the clock signal generated by the voltage controlled oscillator to the clock signal obtained from the printed circuit board under test.

The programmable time advance circuit compensates for the delay in the clock signal generated by the voltage controlled oscillator and applied by the driver circuit to the printed circuit board under test by injecting a clock advance signal into the phase detector portion of the phase locked loop. This clock advance signal is a signal of fixed magnitude and duration that matches the measured time delay occasioned by the response time of the conductors and the response time of the driver circuits of the printed circuit board test system. By summing this clock advance signal with the clock adjust signal from the phase detector, the output of the voltage controlled oscillator, as applied through the driver circuit to the printed circuit board under test, is exactly synchronized to the clock signal generated by the printed circuit board under test. The clock advance signal time shifts the clock signal generated by the voltage controlled oscillator to offset the delay time occasioned by the conductors and driver circuits while the clock adjust signal from the phase detector 21 adjusts the frequency of the clock signal generated by the voltage-controlled oscillator to match the clock signal generated by the printed circuit board under test. The clock advance signal is programmable so that a user-definable fixed amount of time advance can be provided in this system.

DETAILED DESCRIPTION OF THE DRAWING

Figure 1:
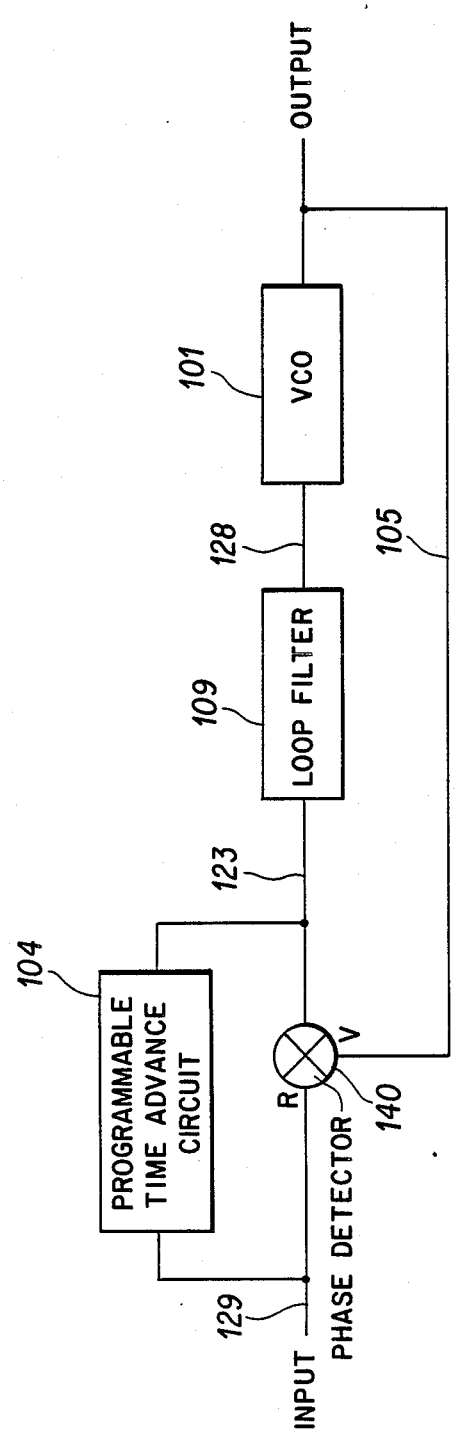
FIG. 1 illustrates a phase locked loop (PLL) with time advance circuit.

It is a problem in the field of printed circuit board test systems to synchronize the clock of the printed circuit board test system with the clock signal that is generated on the printed circuit board under test. A printed circuit board test system is a completely integrated set of resources that is used for testing analog, hybrid and digital circuits. The printed circuit board test system typically performs shorts and opens tests; analog, hybrid and digital in-circuit tests; and analog, hybrid and digital cluster and functional tests on the devices that are mounted on the printed circuit board.

The test sequences executed by the printed circuit board test system are programmed into the printed circuit board test system by a test engineer to match the operational requirements of the printed circuit board under test. The printed circuit board test system includes a plurality of signal generation circuits and signal detector circuits. The test engineer programs the printed circuit board test system to generate a timed sequence of signals of known magnitude, shape and duration. Electrical interconnection to the printed circuit board under test is accomplished through a "bed of nails" interface that consists of a plurality of electrically conductive pins in a prearranged pattern on the printed circuit board test system. The bed of nails is connected to the signal generation and signal detector circuits. The printed circuit board under test is placed on the bed of nails to electrically interconnect various test points on the printed circuit board under test with the printed circuit board test system. The programmable signal generation circuits are used to apply a timed sequence of signals to various ones of the pins in the bed of nails to drive the printed circuit board under test. The signal detector circuits are connected to other pins on the bed of nails to monitor the response of the printed circuit board under test to these applied test signals.

A problem with this arrangement is that it is difficult to synchronize the clock signals on both the printed circuit board under test and the printed circuit board test system. In particular, in many cases the printed circuit board under test has a clock signal generator circuit which operates independently of the clock signal generator circuit on the printed circuit board test system. In existing printed circuit board test systems, the two clocks are synchronized by the printed circuit board test system monitoring the clock signal generated by the printed circuit board under test and using a phase locked loop to adjust the clock frequency and phase of the clock signal generation circuit on the printed circuit board test system to match the clock signal generated by the printed circuit board under test. The problem with this arrangement is that there exists a finite timing difference between the clock signal generated by the printed circuit board test system and the clock signal generated by the printed circuit board under test, due to the fact that the printed circuit board test system conductors and driver circuits have a certain delay time. Thus, while the two clock signals are synchronized at the input of the phase locked loop of the printed circuit board test system, when the clock signal generated by the printed circuit board test system is applied to the printed circuit board under test there is a certain delay in the signal occasioned by the response time of the driver circuits and associated conductors.

The programmable time advance circuit of the present invention functions to offset the inherent delay occasioned by the conductors and the driver circuits to provide a clock signal at the output of the printed circuit board test system that exactly matches the clock signal of the printed circuit board under test at the printed circuit board under test. This is accomplished by inserting a clock advance signal into the phase locked loop to advance the timing of the clock signal generator circuit in the printed circuit board test system to compensate for the delay occasioned by the conductors and driver circuits in the printed circuit board test system.

The clock signal generation circuit in the printed circuit board test system consists of a voltage controlled oscillator which generates a clock signal at a predetermined center frequency, which clock signal is adjustable by a control signal applied to the voltage controlled oscillator. The clock signal generated by the voltage controlled oscillator is applied along with the clock signal from the printed circuit board under test to the input of a phase detector. The phase detector compares the two clock signals and generates a clock adjust signal that is indicative of both the direction and the magnitude of the difference between these two clock signals. This clock adjust signal is applied to the voltage controlled oscillator to adjust the center frequency of the clock signal generated therein to synchronize the clock signal generated by the voltage controlled oscillator to the clock signal obtained from the printed circuit board under test.

The programmable time advance circuit compensates for the delay in the clock signal generated by the voltage controlled oscillator and applied by the driver circuit to the printed circuit board under test by injecting a clock advance signal into the phase detector portion of the phase locked loop. This clock advance signal is a signal of fixed magnitude and duration that matches the measured time delay occasioned by the response time of the conductors and the response time of the driver circuits of the printed circuit board test system. By summing this clock advance signal with the clock adjust signal from the phase detector, the output of the voltage controlled oscillator, as applied through the driver circuit to the printed circuit board under test is exactly synchronized to the clock signal generated by the printed circuit board under test. The clock advance signal time shifts the clock signal generated by the voltage controlled oscillator to offset the delay time occasioned by the conductors and driver circuits while the clock adjust signal from the phase detector adjusts the frequency of the clock signal generated by the voltage controlled oscillator to match the clock signal generated by the printed circuit board under test. The clock advance signal is programmable so that a user-definable fixed amount of time advance can be provided in this system.

Phase Locked Loop (PPL)

FIG. 1 shows a phase locked loop (PLL) made up of phase detector 140, loop filter 109 and voltage controlled oscillator (VCO) 101. In the present invention, programmable time advance circuit 104 is added to the PPL.

Generally, a phase detector, such as phase detector 140, has two inputs R (reference) and V (VCO), and one output. The phase detector measures the difference, in time, between R and V and emits an output signal which is indicative of that difference. In FIG. 1, R is the reference signal on line 129 and V is the signal output by VCO 101 on line 105, and the output of phase detector 140 is emitted on line 123. In FIG. 1, the output signal on line 123 is an electrical charge. The operation of phase detector 140 can be represented mathematically as follows:

$$Q_o = k_{pd}*(t_R - t_V)$$

where $k_{pd}$ ia a fixed constant, $(t_R - t_V)$ is the difference in time between the R input and the V input, and $Q_o$ is the charge output from the phase detector.

In FIG. 1, the output of phase detector 140 is the input to the loop filter 109 on line 123. Generally, a loop filter 109 performs two functions:

(1) it converts the charge output from the phase detector to a voltage to drive VCO 101, and (2) it provides a filtering integration function which is required for the loop to work.

VCO 101 is a voltage controlled oscillator whose frequency output dependant on its voltage input. The operation of VCO 101 can be represented mathematically as follows:

$$F_o = k_{vco}*V_{in}$$

where $F_o$ is the frequency output of VCO 101, $k_{vco}$ is the VCO 101 tuning constant and $V_{in}$ the VCO input voltage (that is, the output of loop filter 109 on line 128 in FIG. 1).

The "loop" in the PLL of FIG. 1 is completed by line 105 which delivers the output signal of VCO 101 to the V input of phase detector 140.

Thus, for example, given a square wave voltage signal at the R input, phase detector 140 measures the difference between the R input and V input and adjusts the frequency of VCO 101 (via loop filter 109) to equal the input frequency present at R. When the frequencies of the input signals at R and V match, the loop is said to be "phase locked". One characteristic of a phase locked loop is that when the loop is locked there will be no charge output from the phase detector onto line 123 because $Q_o = k_{pd}*(t_R - t_V)$, where $(t_R - t_V) = 0$. This result is crucial because if there is any charge flowing into loop filter 109, its voltage output will change and hence the loop cannot be locked since the VCO 101 frequency will also be changing. Thus, when the loop is locked, the charge flowing into the loop filter must be zero, and the voltage output of the loop filter will be unchanging.

Operation of the PPL as discussed above is well known in the prior art. The present invention involves addition of the programmable time advance circuit 104 to the PLL.

The time advance circuit (104) operates by injecting a fixed amount of charge per reference cycle onto the phase detector output, conductor 123. Since, when the loop is locked, the charge into the loop filter must be zero, the charge injected by the advance circuit 104 must somehow be removed. This is done by the phase detector 140. To cancel the charge injected by the time advance circuit 104, the phase detector 140 output, $Q_o = k_{pd}*(t_R - t_V)$, must be equal and opposite to the charge injected by advance circuit 104. Thus we have:

$$Q_{adv} = -Q_o = -k_{pd}*(t_R - t_V)$$

where $Q_{adv}$ represents the charge injected by advance circuit 104. Thus, $Q_{adv}$ is non-zero, $(t_R - t_V)$ will also be non-zero and hence we have an offset in time between the R input and the V input. This offset can be either positive (R input lead V input) or negative (V input leads R input) by making $Q_{adv}$ positive or negative.

Programmable Time Advance Circuit-Functional Description

Figure 2:
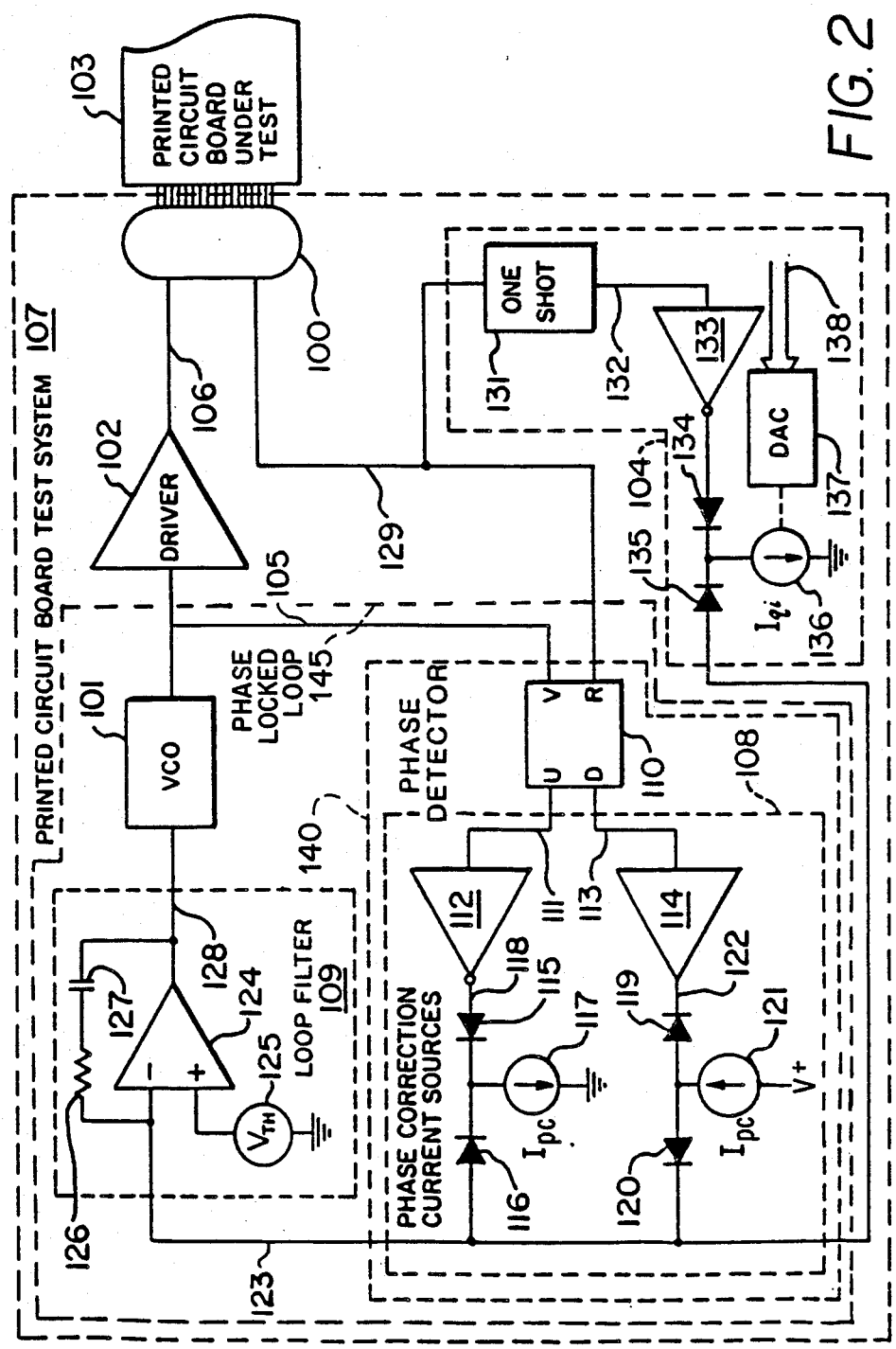
FIG. 2 illustrates the programmable time advance circuit.

FIG. 2 illustrates the programmable time advance circuit of the present invention. On FIG. 2 is illustrated a portion of a printed circuit board test system 107 which is interconnected through a "bed of nails" 100 to a printed circuit board under test 103. The printed circuit board under test 103 is assumed to have a clock signal generation circuit included therein. The output of the clock signal generation circuit of the printed circuit board under test 103 is conveyed by lead 129 in printed circuit board test system 107. Printed circuit board test system 107 includes a voltage controlled oscillator 101 which is interconnected via lead 105 to driver circuit 102. The clock signal generated by voltage controlled oscillator 101 is output via lead 105 to driver 102 where it is replicated and applied over lead 106 and bed of nails 100 to one or more predetermined leads on the printed circuit board under test 103.

A phase locked loop 145 is provided to synchronize the output of the voltage controlled oscillator 101 with the clock signal generated by the printed circuit board under test 103. The phase locked loop 145 consists of phase detector 140, loop filter 109 and VCO 101. Phase detector 140 generates a clock adjust signal which is applied to voltage controlled oscillator 101 via loop filter 109. In addition, a programmable time advance circuit 104 is connected to the clock signal generated by the printed circuit board under test 103 to advance the clock signal generated by voltage controlled oscillator 101. The output signal of programmable time advance circuit 104 is connected to lead 123 which inputs this signal to voltage controlled oscillator 101 via loop filter 109.

In operation, the clock signal generated by the printed circuit board under test 103 is applied over lead 129 to one input of the phase detector 140. The clock signal generated by voltage controlled oscillator 101 is applied over lead 105 to the other input of phase detector 140. Phased detector 140 includes a phase detector integrated circuit (IC) 110 that functions to measure the difference between the two clock signals applied to the input therein. Phase detector IC 110 is a device well known in the art and, for example, would be a Motorola MC 12040 device. Phase detector IC 110 determines the magnitude and direction of the difference between the reference clock signal which is obtained from printed circuit board under test 103 on lead 129 and the clock signal generated by voltage controlled oscillator 101 as applied to lead 105.

Phase Correction Current Sources

Phase detector IC 110 has two output terminals labeled U and D, which output terminals are used to indicate that the generated clock signal is less than or greater than the reference clock signal in frequency, respectively. The signal generated by phase detector IC 110 at terminal U is applied via lead 111 to one input of phase correction current source circuit 108. This signal is applied to an inverting driver circuit 112 that drives lead 118. The signal appearing on lead 118 is an inverted replica of the signal output by phase detector IC 110 on lead 111. The magnitude, timing and duration of the signal on lead 111 is indicative of the time difference between the reference clock signal generated by printed circuit board under test 103 and the clock signal generated by voltage controlled oscillator 101. Phase detector IC 110 applies this signal to lead 111 when the clock signal generated by voltage controlled oscillator 101 is less than the clock signal generated by printed circuit board under test 103 in frequency. Otherwise, no signal is applied to lead 111 by phase detector circuit 110. The signal appearing on lead 111, as reproduced in inverted form on lead 118 controls the current switch made up of current source 117 and diodes 115 and 116. If the voltage at lead 118 is greater than the voltage on lead 123, diode 115 turns on, diode 116 turns off and all of current Ipc is drawn through diode 115. If the voltage at lead 118 is less than the voltage on lead 123, diode 115 turns off, diode 116 turns on and all of current Ipc is drawn through diode 116. The current drawn through diode 116 adjusts the clock signal as produced by voltage controlled oscillator 101 as is described below.

In similar fashion, the D terminal of phase detector IC 110 provides a signal indicative of the timing difference between the reference clock signal generated by printed circuit board under test 103 and the clock signal generated by voltage controlled oscillator 101 when the clock signal generated by voltage controlled oscillator 101 is greater in frequency then the clock signal generated by printed circuit board under test 103. Otherwise, no signal is applied to lead 113 by by phase detector IC 110. This correction signal applied to terminal D of phase detector IC 110, is carried by lead 113 to driver circuit 114, which replicates the signal onto lead 122. The signal appearing on lead 122, controls the current switch made up of current source 121 and diodes 119 and 120. If the voltage at lead 122 is greater than the voltage on lead 123, diode 120 turns on, diode 119 turns off and all of current Ipc is drawn through diode 120. If the voltage at lead 122 is less than the voltage on lead 123, diode 120 turns off, diode 119 turns on and all of current Ipc is drawn through diode 119.

The circuitry of phase correction current sources 108 thereby acts as a current switch that has three states: current source, current sink, no current. The correction signal applied through diode 116 or 120 by phase correction current source 108 is output on lead 123 to a loop filter 109 which functions as an integrator circuit to generate a control signal to modify the frequency of voltage controlled oscillator 101. Thus, phase detector IC 110 drives phase correction current sources 108 to produce a correction signal that is indicative of the phase offset of the input signals to phase detector circuit 110. This correction signal is applied to the inverting input of differential amplifier 124 whose non-inverting input is connected to the voltage reference source 125. Resistor 126 and capacitor 127 are connected between the inverting input of differential amplifier 124 and the output terminal of differential amplifier 124 to provide the integrating function. The output signal produced by loop filter 109 is applied via lead 128 to the input terminal of voltage controlled oscillator 101 to adjust the voltage controlled oscillator 101 so that the input signals to phase detector IC 110 do not exhibit any offset.

Programmable Time Advance Circuit 104

While this above described circuitry can produce a clock signal at the output of voltage controlled oscillator 101 that exhibits no offset when compared with the clock signal generated by printed circuit board under test 103, this generated clock signal must be applied over lead 105 to driver circuit 102 which replicates this clock signal and applies it over lead 106 to printed circuit board under test 103 via bed of nails 100. Conductors 105 and 106, bed of nails 100 and driver circuit 102 all produce a non-zero delay to the clock signal generated by voltage controlled oscillator 101. Therefore, synchronizing the output of voltage controlled oscillator 101 with the clock signal generated by printed circuit board under test 103 at the input of phase detector 140 does not insure that these two signals are in synchronization at printed circuit board under test 103 where the synchronization of these clock signals is critical. In order to compensate for the delay in the clock signal produced by conductors 105, 106, bed of nails 100 and driver circuit 102, programmable time advance circuit 104 provides a predetermined fixed advance to the clock signal generated by voltage controlled oscillator 101 to exactly offset the delay occasioned by leads 105, 106 and driver 102. This circuit therefore produces a clock signal applied to printed circuit board under test 103 that is exactly in synchronization with the clock signal generated by printed circuit board under test 103. This time advance is effectuated by programmable time advance circuit 104 injecting a fixed packet of charge per clock cycle into the summing node of the phase correction current sources 108. Feedback operation of the phase locked loop 145 that is implemented by phase detector 140, loop filter 109, and VCO 101 then adjusts the clock signal produced by VCO 101 until the inputs of the phase detector IC 110 are offset by precisely an amount to exactly cancel the delay occasioned by leads 105, 106 and driver 102.

The operation of programmable time advance circuit 104 is initiated by the occurrence of a clock signal on lead 129, which clock signal is generated by printed circuit board under test 103. This clock signal triggers one shot circuit 131 to produce a pulse of fixed time duration delta-tqi. This pulse of fixed time duration is inverted by driver circuit 133 and switched through diode 134 to constant current source 136. This signal pulse applied by driver circuit 133 reverse biases switching diode 134 and thereby enables the current produced by constant current source 136 to be applied via switching diode 135 to the summing node of phase correction current sources 108. The magnitude of the current drawn by constant current source 136 is programmable in that a signal applied on data bus 138 to digital-to-analog converter circuit 137 defines the magnitude of the current produced by constant current source 136. The value of the current produced by constant current source 136 can be controlled with greater precision than the duration of the drive signal produced by one shot circuit 131. Thus, the printed circuit board test system 107 is programmed to establish a fixed value for the current Iqi drawn by constant current source 136. This current is applied for a predetermined period of time due to the action of one shot circuit 131 which triggers in synchronization with the clock signal produced by printed circuit board under test 103 to produce a pulse of fixed duration.

It is important to note that the signal summing that takes place is a charge summing operation. Phase correction current sources 108, when switched on by phase detector circuit 110, apply a fixed value current to loop filter 109 for a length of time determined by the duration of the output signal produced by phase detector circuit 110. Similarly, the charge removed from loop filter circuit 109 is equal to the current drawn by constant current source 136 multiplied by the length of time per clock cycle that constant current source 136 is enabled by one shot circuit 131 and its associated signal inverting driver circuit 133. The operation of programmable time advance circuit 104, when the PLL is locked, is mathematically described as follows:

| | (charge dumped into summing node) = (charge pulled out of summing node) ** or ** $I_{pc}(\text{delta\_trv}) = I_{qi}(\text{delta\_tqi})$ |
|---|---|
| where: | $I_{pc}$ —>phase correction current sources (mA) delta_trv —>offset of inputs to the phase detector circuit 140 $I_{qi}$ —>charge injection current source (mA) delta_tqi —>fixed duration of the charge injection (nS) |

For example, $I_{pc}$ is fixed at 6 mA, delta_tqi is fixed at 20 nS and $I_{qi}$ can be a programmable current source (DAC). As a result, delta_trv is programmable also, and the gain is:

| delta_trv/$I_{qi}$ | = (delta tqi)/$I_{pc}$ |
|---|---|
| | = 20 nS/6 mA |
| | = 3.33 nS/mA |

Signal Waveforms

Figure 3:
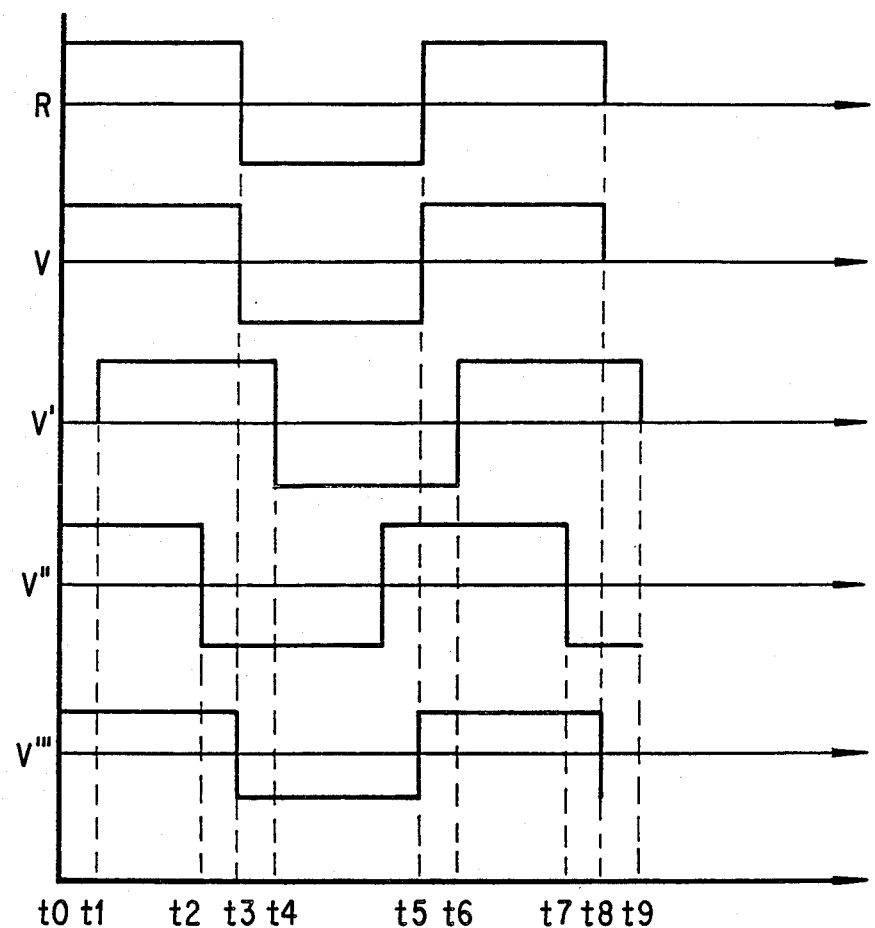
FIG. 3 illustrates timing signal wave forms for the programmable time advance circuit.

FIG. 3 illustrates various signal waveforms representative of the operation of the programmable time advance circuit 104. Square wave signals are illustrated for simplicity although periodic pulse signals or any other similar clock signal can be used. The first signal waveform shown on FIG. 3 is labeled R and is the reference clock signal obtained from printed circuit board under test 103 as applied to lead 129. The signal waveform labeled V is the clock signal generated by voltage controlled oscillator 101 and applied to lead 105, without the operation of programmable time advance circuit 104. The signal waveform V' is the clock signal V as it appears at printed circuit board under test 103. Thus, the clock signal is delayed by a time of t4–t3 due to the response time of driver 102 and the conductors 105, 106 and the conductors in bed of nails 100.

Programmable time advance circuit 104 generates a clock advance signal such that the clock signal generated by voltage controlled oscillator 101 V″ leads the reference clock signal generated by printed circuit board under test 103 by a time t3–t2 which time is exactly equal to the delay time t4–t3 occasioned by the response time of driver 102, conductors 105, 106 and bed of nails 100. Therefore, the clock signal applied to printed circuit board under test 103 by printed circuit board test system 107 is V‴, which signal is exactly synchronized with the reference clock signal R generated by the clock signal generation circuit of printed circuit board under test 103.

While a specific embodiment of this invention has been described in detail herein, it is expected that those skilled in the art can design other embodiments that differ from this particular embodiment but fall within the scope of the appended claims.

I claim:

1. A programmable time advance apparatus for a clock generation circuit that is connected to a reference clock signal comprising:

means for generating a clock signal having an input control terminal, said clock signal having a predetermined frequency, which frequency is adjustable via the application of control signals to said input control terminal;

means connected to said reference clock signal and said generated clock signal for producing a clock adjust signal, applied to said input control terminal, to adjust the frequency of said generated clock signal;

means for producing a clock advance signal of predetermined magnitude; and means for applying said clock advance signal to said generating means concurrent with said clock adjust signal to advance the timing of said generated clock signal with respect to said reference clock signal by a fixed time offset.

2. The circuit of claim 1 wherein said applying means includes:

means for programming said clock advance signal of predetermined magnitude into said producing means to produce said fixed time offset to advance said generated clock signal.

3. The circuit of claim 2 wherein said applying means further includes:

means for periodically applying said clock advance signal to said generating means in synchronization with said reference clock signal.

4. The circuit of claim 3 wherein said applying means further includes:

means for summing said clock adjust signal and said clock advance signal.

5. The circuit of claim 1 wherein said producing means includes:

phase detector means connected to said reference clock signal and said generated clock signal for generating first/second control signals in response to said generated clock signal being less/greater in frequency than said reference clock signal, respectively.

6. The circuit of claim 5 wherein said producing means further includes:

clock adjust signal generating means responsive to said first and second control signals for producing said clock adjust signal of magnitude and polarity indicative of the direction and magnitude of the phase timing difference between said reference clock signal and said generated clock signal.

7. The circuit of claim 6 wherein said clock adjust signal generating means includes:

first control signal generating means responsive to said first control signal for producing a first difference signal of magnitude and polarity indicative of the direction and magnitude of the phase timing difference between said reference clock signal and said generated clock signal.

8. The circuit of claim 7 wherein said clock adjust signal generating means includes:

second control signal generating means responsive to said second control signal for producing a second difference signal of magnitude and polarity indicative of the direction and magnitude of the difference between said reference clock signal and said generated clock signal.

9. The circuit claim 8 wherein said producing means further includes:

means for applying either said first or said second difference signals as said clock adjust signal to said generating means input control terminal.

10. A method of producing a programmable time advance for a clock generation circuit having an input control terminal comprising the steps of:

generating a clock signal having a predetermined center frequency, which center frequency is adjustable via the application of control signals to said input control terminal;

measuring the difference between a reference clock signal and said generated clock signal to produce a clock adjust signal to adjust said center frequency of said generated clock signal;

producing a clock advance signal of predetermined magnitude; and concurrently applying said clock advance signal and said clock adjust signal to said input control terminal of said clock generation circuit to advance the timing of said generated clock signal with respect to said reference clock signal by a fixed time offset.

11. The method of claim 10 wherein said step of combining includes the step of:

programming said clock advance signal of predetermined magnitude to produce said fixed time offset.

12. The method of claim 11 wherein said step of combining further includes the step of:

periodically applying said clock advance signal to said input control terminal in synchronization with said reference clock signal.

13. A programmable time advance apparatus for a clock generation that is connected to a reference clock signal comprising:

voltage controlled oscillator means for generating a clock signal having a predetermined center frequency, which center frequency is adjustable via the application of control signals to an input control terminal;

generating means connected to a reference clock signal and said generated clock signal for generating a difference signal indicative of the direction and magnitude of the frequency difference between said reference clock signal and said generated clock signal;

clock advance means for generating a clock advance signal of predetermined magnitude;

means for applying said clock advance signal concurrent with said difference signal to said voltage controlled oscillator means input control terminal to advance the timing of said generated clock signal with respect to said reference clock signal by a fixed time offset.

14. The circuit of claim 13 wherein said generating means includes:

phase detector means for producing first/second control signals indicative of said generated clock signal being less/greater in frequency than said reference clock signal, respectively;

means for converting the duration of said first-/second control signals into a difference current of duration proportional to said first/second control signal duration.

15. The circuit of claim 13 wherein said clock advance means includes:

means for generating a clock advance current of fixed magnitude and duration.

16. The circuit of claim 13 wherein said applying means includes:

summing means for concurrently applying said difference current and said clock advance current to said voltage controlled oscillator means input control terminal as said control signals.

* * * * *